(12) United States Patent
Jones (10) Patent No.: US 6,219,241 B1
(45) Date of Patent: Apr. 17, 2001

(54) ADVANCED ZERO-INSERTION FORCE (ZIF) SOCKET WITH HEAT SINK ALIGNMENT AND RETENTION MECHANISMS

(75) Inventor: David A. Jones, El Dorado Hills, CA (US)

(73) Assignee: Intel Coroporation, Santa Clara, CA (US)

( * ) Notice: Subject to any disclaimer, the term of this patent is extended or adjusted under 35 U.S.C. 154(b) by 0 days.

(21) Appl. No.: 09/330,160

(22) Filed: Jun. 11, 1999

(51) Int. Cl.[7] ...................................................... H05K 7/20
(52) U.S. Cl. .......................... 361/704; 361/715; 361/786; 439/342; 439/487
(58) Field of Search ..................... 174/16.3; 165/80.2, 165/80.3, 185; 361/704, 707, 709–710, 715, 785–786, 790; 439/485, 487, 342

(56) References Cited

U.S. PATENT DOCUMENTS

| | | | |
|---|---|---|---|
| 5,123,850 | * | 6/1992 | Elder et al. ........................... 439/487 |
| 5,547,389 | * | 8/1996 | Hsu ........................................ 439/342 |
| 5,893,770 | * | 4/1999 | Gober .................................... 439/342 |
| 6,004,141 | * | 12/1999 | Abe et al. .............................. 439/342 |

* cited by examiner

*Primary Examiner*—Gregory Thompson
(74) *Attorney, Agent, or Firm*—Antonelli, Terry, Stout & Kraus, LLP

(57) ABSTRACT

An advanced zero-insertion force (ZIF) socket for coupling an electronic package having a plurality of electrical pins and a heat sink having a heat sink alignment and retention means onto a printed circuit board (PCB) of a computer system. Such a ZIF socket comprises a base having a plurality of receptacles adapted to receive electrical pins of an electronic package; a top plate slidably mounted on the base, having a plurality of pin insertion apertures adapted to permit insertion of the electrical pins of the electronic package; and a cam mechanism which is operable for sliding the top plate over the base in a first direction to permit insertion of the electrical pins of the electronic package into respective apertures of the base, and for sliding the top plate over the base in a second direction opposite to the first direction to secure an electrical coupling of the electrical pins of the electronic package with the receptacles of the base while simultaneously securing the heat sink in place on top of the electronic package and the base, via the heat sink retention means.

31 Claims, 7 Drawing Sheets

ADVANCED ZERO-INSERTION FORCE (ZIF) SOCKET WITH HEAT SINK ALIGNMENT AND RETENTION MECHANISMS

TECHNICAL FIELD

The present invention relates to an electrical socket, and more particularly, relates to an advanced zero-insertion force (ZIF) socket having different heat sink alignment and retention mechanisms for detachably securing an electronic package and/or an integrated circuit (IC) chip.

BACKGROUND

Electrical sockets may be used to secure electronic packages and/or integrated circuit (IC) devices, for example, onto a system board (e.g., a motherboard or a printed circuit board "PCB") of a computer system. These electrical sockets may be constructed for easy installation and replacement of electronic packages (e.g., electrical components) and/or integrated circuit (IC) devices, such as complex memory chips and advanced microprocessor chips. The electrical sockets may also be available in different sizes and configurations, including, for example, low-insertion force (LIF) sockets and zero-insertion force (ZIF) sockets.

Low-insertion force (LIF) sockets may be suitable for detachably securing traditional electronic packages and/or integrated circuit (IC) devices with low pin counts onto a system board of a computer system. However, zero-insertion force (ZIF) sockets are more desirable for advanced electronic packages and/or IC devices which have larger pin counts, since no or zero insertion force and removal force are required. For example, advanced microprocessor chips with high pin counts are typically installed in a zero-insertion force (ZIF) socket which is soldered directly to a system board of a computer system. The ZIF sockets are commonly used to secure advanced microprocessor chips onto a printed circuit board (PCB). This is because the advanced microprocessor chips may be accommodated without fear of damaging the chips or the electrical pins (connections) of the microprocessor chips which provide electrical contacts from the microprocessor chips to the system board.

A ZIF socket may typically include a release handle which, when open, permits easy installation of an electronic package and/or an IC device such as a microprocessor chip into the socket. Subsequent closure of the handle may secure the microprocessor chip in place. A heat sink may be then affixed on top of the microprocessor chip installed in the ZIF socket by mechanical means, such as a retainer clip, for dissipating the heat generated from the microprocessor chip. The heat sink may contain a thermally conductive heat sink in a form of a flat plate, generally of the same size as the microprocessor chip, and a plurality of cooling (radiation) fins extending upwardly from the flat plate. A heat sink fan may then be utilized to increase thermal dissipation of the heat sink member and maintain the temperature of the electronic package and/or the IC device at an acceptable level.

However, these commonly available ZIF sockets used for securing an electronic package and/or an IC device onto a system board of a computer system contain several disadvantages, especially in cases where an open or unprotected semiconductor die is used. First, the electronic package or IC device such as the microprocessor chip must be properly installed on the ZIF socket, and then the heat sink must be aligned properly with the ZIF socket, and then packaged carefully and squarely on top of an open die microprocessor chip in order to prevent damage to the open die microprocessor chip during assembly due to uneven loading and to ensure correct microprocessor operation. In practice, however, the heat sink may often (e.g., during hasty manufacturing/assembly practice) be slammed down onto an open die microprocessor chip at an angle with often excessive forces during assembly. As a result, an open die microprocessor chip can occasionally be damaged (e.g., ranging from edge chipping to major die cracks). Thermal interface material applied on the surface of the microprocessor chip for increased thermal coupling efficiency with a heat sink can frequently be scratched or disrupted. Secondly, separate steps are needed to secure an electronic package on the ZIF socket and a heat sink on the electronic package which may be burdensome. Lastly, selected portions of cooling fins of the heat sink may be eliminated to provide clearance for separately provided clips so as to secure the heat sink onto an open die microprocessor chip. The additional clips used to secure the heat sink onto an open die microprocessor chip can be unreliable and costly. Likewise, the elimination of cooling fins directly above the microprocessor chip can lessen the thermal performance and efficiency of the heat sink. Accordingly, there is a need to provide an advanced ZIF socket having heat sink retention and alignment features that can prevent the heat sink from damaging an open die microprocessor chip due to uneven loading and/or excessive forces during assembly, and eliminate the separate assembly of an open die microprocessor chip, a heat sink and an additional clip used to secure the heat sink in place while maximizing the thermal performance of the heat sink.

SUMMARY

Accordingly, various embodiments of the present invention are directed to an advanced zero-insertion force (ZIF) socket system providing controlled loading of a heat sink with respect to an electrical device. Such an advanced ZIF socket system may comprise an electrical device, a socket accommodating selective electrical connections of the electrical device, a heat sink, and a plurality of controlled loading member/aperture pairs providing controlled loading of the heat sink with respect to the electrical device by requiring aligned mating of the loading member/aperture pairs, where ones of the loading members of the loading member/aperture pairs are provided on one of the socket and the heat sink, while mating ones of loading apertures are provided on an opposite one of the socket and the heat sink.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of sockets and heat sinks, and all electronic packages and IC devices, including new microprocessor chips which may become available as computer technology develops in the future. Further, the present invention is not limited to use in computer systems, but is suitable for applications in many industries and/or environments such as automotive, telecommunications, etc. However, for the sake of simplicity, discussions will concentrate mainly on exemplary use of a zero-insertion force (ZIF) socket and a compatible heat sink assembly onto a system board of a computer system, although the scope of the present invention is not limited thereto.

Figure 1:
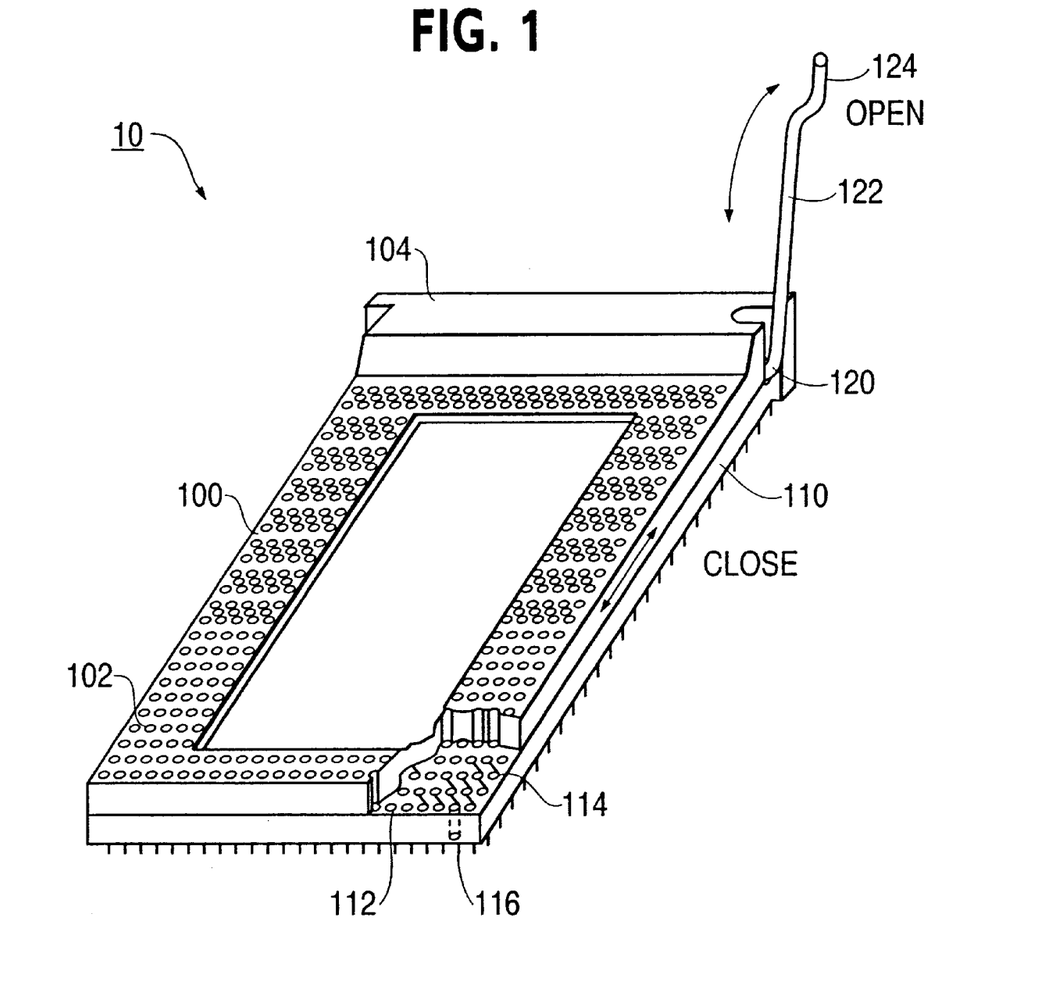
FIG. 1 is a perspective view of an example zero-insertion force (ZIF) socket.

Attention now is directed to the drawings and particularly to FIG. 1, a less-advantageous zero-insertion force (ZIF) socket 10 used to secure an electronic package such as a microprocessor chip onto a system board of a computer system is illustrated. As shown in FIG. 1, the ZIF socket 10 may include a top plate (cover) 100, a base 110, and a cam mechanism 120. The top plate 100 and the base 110 may be made from dielectric materials such as plastics, ceramics and other insulators, and can be varied in sizes, shapes and openings to secure different types of electronic packages and/or IC devices onto a system board of a computer system as desired. The top plate 100 may be slidably mounted on the base 110, and may be movable over a top surface of the base 110 between an open position and a closed position in response to movement of the cam mechanism 120.

The top plate 100 of an example zero-insertion force (ZIF) socket 10 may contain a plurality of pin insertion apertures 102 for accepting electrical pins from an electronic package such as an open die microprocessor chip. The base 110 of the example ZIF socket 10 may contain a corresponding plurality of openings (receptacles) 112, housing spring elements 114, each of which has a tail portion 116. The tail portions 116 may protrude through a plurality of corresponding openings formed in the system board (not shown), and may be soldered, for to example, to the system board circuitry of a computer system. When the top plate 100 is in an open position, that is, when the top plate 100 moves in a first direction toward an open position, the electrical pins (e.g., connections) of an electronic package such as a microprocessor chip may be freely inserted through the aperture 102 in the top plate 100 and into their respective openings (receptacles) 112 in the base 110 and the spring elements 114. When the top plate 100 is in a closed position, that is, when the top plate 100 moves in a second, opposite direction toward a closed position, the electrical pins of an electronic package may be engaged physically (e.g., pinched) and electrically with the respective spring elements 114 of the base 110. Conversely, when the top plate 100 moves again back toward an open position, the pins of an electronic package may be physically disengaged from the respective spring elements 114 of the base 110 for easy removal of the electronic package from the ZIF socket 10.

The cam mechanism 120 provides a means for sliding the top plate 100 over the base 110 between the open and closed positions. The cam mechanism 120 (also referred to herein as a camshaft or crankshaft) may be mounted in a tunnel between the top plate 100 and the base 110, and may be located inside a raised portion 104 of the top plate 100. The cam mechanism 120 may include a lever 122 which is transversely connected to rotate the camshaft in horizontal (first and second) directions, causing the top plate 100 to translate relative to the base 110. The lever 122 may contain an end portion 124 which is bent at an angle of approximately 15°–45° from the axis of the lever 122. The bent end 124 of the lever 122 may allow for the lever 122 to be easily grasped for rotation in the horizontal directions to translate the top plate 100 over the base 110 between open and closed positions.

Figure 2:
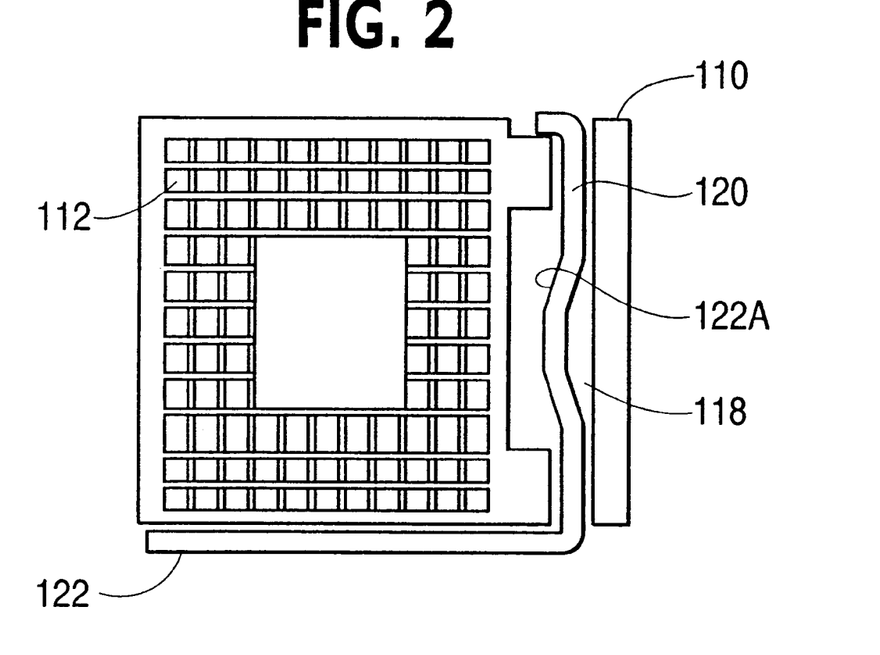
FIG. 2 illustrates a first portion of an example zero-insertion force (ZIF) socket with a lever rotated to a closed position.

Referring to FIG. 2, the base 110 (disassembled from the top plate 100) of the zero-insertion force (ZIF) socket 10 is shown having a channel 118 with a T-shaped plan for holding the camshaft 120. The camshaft 120 is shown as a rod having a circular cross-section with a cam or a jog 122A providing an eccentricity that can deliver an inward thrust for purposes of translating the top plate 100 over the base 110, when the lever 122 of the cam mechanism 120 is rotated in a predetermined direction (e.g., horizontal direction). Alongside the channel 118 may be an array of pin insertion apertures 112 designed to accommodate springs 114 and/or the electrical pins from an electronic package such as an open die microprocessor chip.

Figure 3:
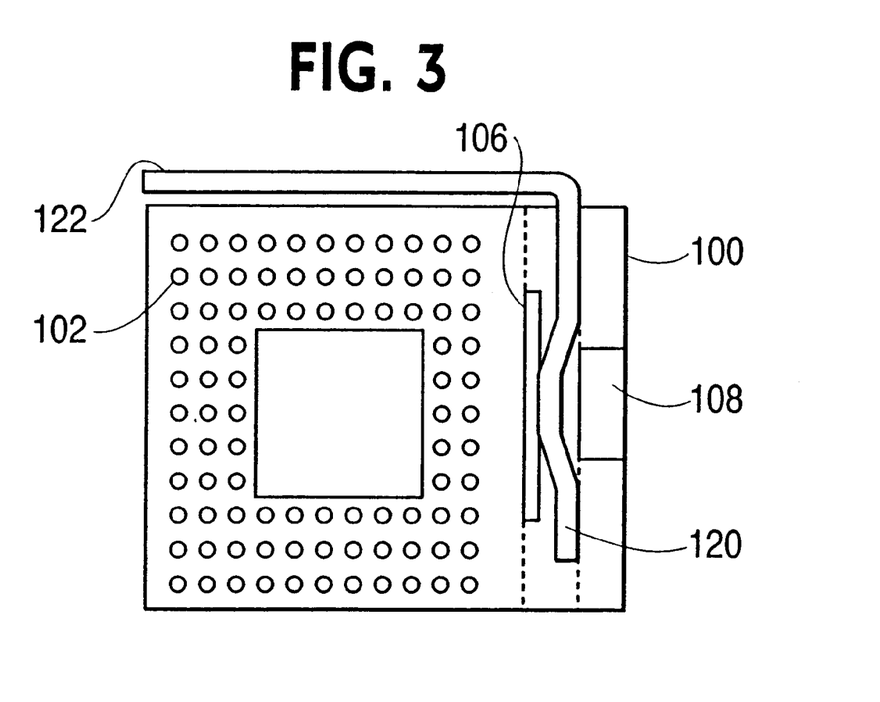
FIG. 3 illustrates a corresponding mating portion of an example zero-insertion force (ZIF) socket with a lever rotated to a closed position.

In FIG. 3, the cam mechanism 120 of the zero-insertion force (ZIF) socket 10 is shown positioned against the underside of top plate 100 (disassembled from the base 110) with the cam or jog 122A transmitting camming force to retaining posts 106 and 108 so as to generate a force necessary to translate the top plate 100 over the base 110, when the lever 122 of the cam mechanism 120 is rotated in the predetermined direction between open and closed positions.

Figure 4:
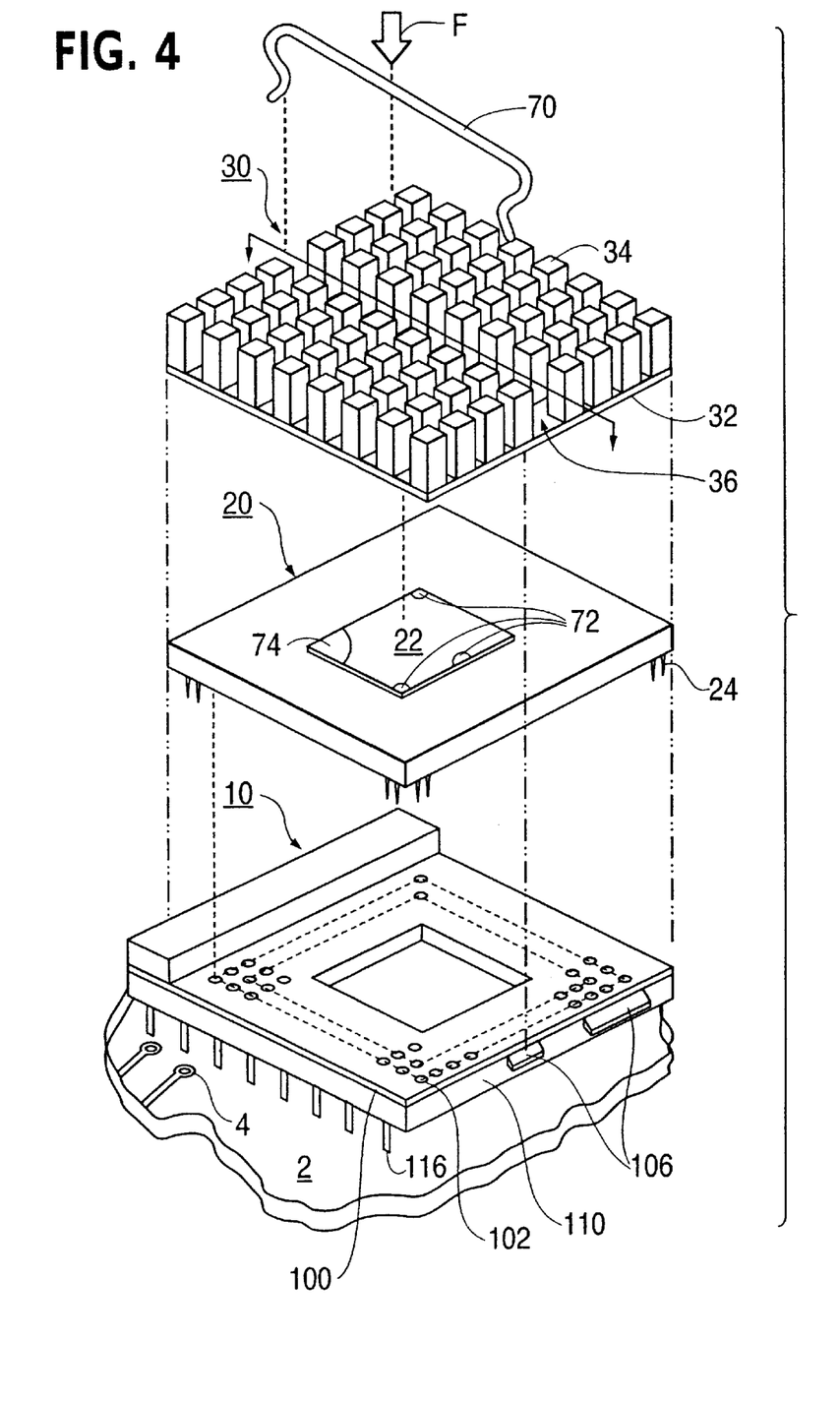
FIG. 4 is a perspective view of an example zero-insertion force (ZIF) socket used for securing an electronic package and a heat sink.

FIG. 4 illustrates an example of a zero-insertion force (ZIF) socket used for securing an electronic package onto a system board 2 of a computer system. Such a system board 2 may be a commonly used board, known as a printed circuit board or a mother board, and may contain a plurality of through-holes 4 for solder mounting of the ZIF socket for easy installation and replacement of electronic packages and/or IC devices from the system board 2. The ZIF socket 10 may include a top plate 100, a base 110 and a cam mechanism 120 assembled and ready for supporting an electronic package 20 and a heat sink 30.

The electronic package 20 may be in a form of a substrate having an open die microprocessor chip 22 disposed thereon. The heat sink 30 may contain a plate 32 with a flat bottom surface. The flat plate 32 may generally be rectangular and its size may be co-extensive with the size of the electronic package 20. The heat sink 30 may contain a large number of cooling (radiation) fins 34 extending or projecting upwardly from the flat plate 32. Usually, the heat sink 30 may also include a channel 36 in a central region extending across the flat plate 32 for purposes of accommodating a separate retainer clip 70 to secure the heat sink 30 and the electronic package 20 onto the ZIF socket 10, via protrusions 106 projecting laterally from a side wall of the ZIF socket 10. A thermal interface material may be disposed between the heat sink 30 and the substrate 20 containing an open die microprocessor chip 22 so as to facilitate thermal coupling and transfer. The thermal interface material may be metallic film, thermal grease, or the like.

Figure 5:
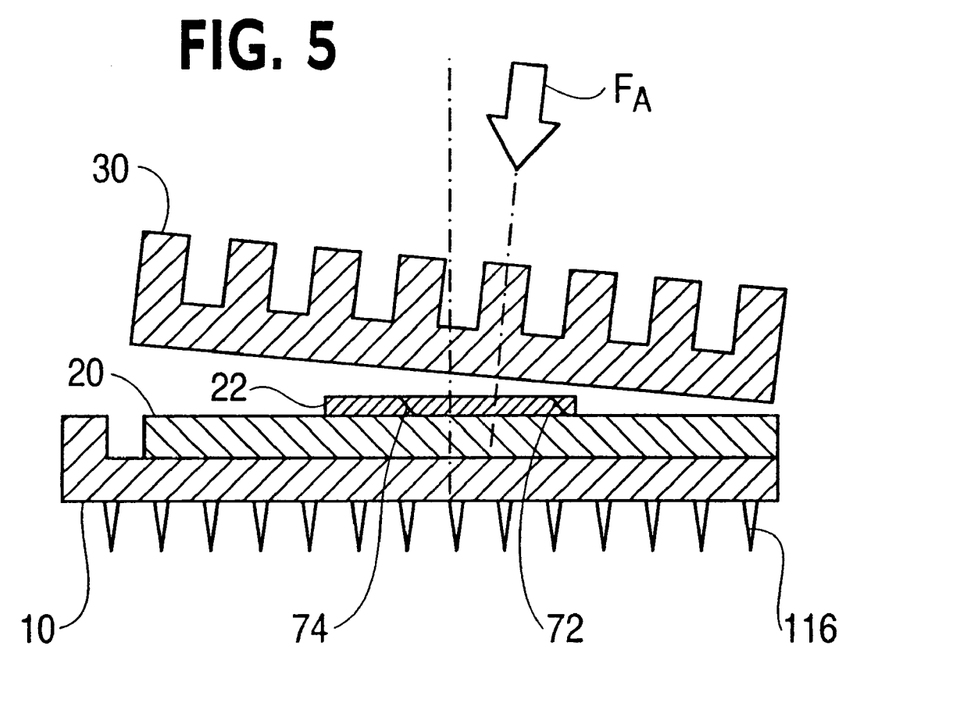
FIG. 5 is a cross-sectional view of an example zero-insertion force (ZIF) socket used to illustrate a disadvantageous angular assembly and assembly force between an open die of an electronic package and a heat sink.

As shown in FIG. 4, the electronic package 20 having an open die microprocessor chip 22 disposed thereon must be properly installed on the ZIF socket 10. Optionally, position pins 24 of the electronic package 20 and corresponding apertures 102 of the ZIF socket 10 may be utilized to retain the electronic package 20 relative to the ZIF socket 10. Next, the heat sink 30 must then be separately aligned properly with the ZIF socket 10 and placed carefully and squarely on top of an open die microprocessor chip 22. This is necessary to prevent damage to the open die microprocessor chip 22 due to uneven loading and/or excessive force during assembly, and to ensure correct microprocessor operation. This can be extremely burdensome during assembly. In practice, the heat sink 30 may be frequently slammed down (illustrated by excessive force F shown in FIG. 4) onto an open die microprocessor chip 22 at a slant or angle with often excessive forces during assembly as shown in FIG. 5. Consequently, an open die microprocessor chip 22 can easily be damaged, as illustrated by the example chip 72 and crack 74 as shown in FIGS. 4 and 5. Moreover, a thermal interface material disposed on the surface of the open die microprocessor chip 22 can be scratched and/or damaged. Secondly, separate steps must be needed to first install and secure the electronic package 20 on the ZIF socket 10, and then install and secure the heat sink 30 on the electronic package 20. These separate steps can also be burdensome during assembly. Lastly, separate clips 70 may be required to secure the heat sink 30 onto an open die microprocessor chip 22, and selected portions of cooling fins 34 of the heat sink 30 must be eliminated (in the central region, for example) to provide clearance for the clips so as to secure the heat sink 30 onto an open die microprocessor chip 22. The additional clips 70 used to secure the heat sink onto an open die microprocessor chip 22 can be costly. Further, the elimination of cooling fins 34 of the heat sink 30 directly above the microprocessor chip 22 can lessen/degrade the thermal performance and efficiency of the heat sink 30.

Currently, needed is an arrangement that prevents the heat sink 30 from damaging an open die microprocessor chip 22 due to an uneven or angular loading and/or excessive forces during assembly. Further, needed is a solution that eliminates the use of a separate clip 70 to secure the heat sink 30 in place relative to the ZIF socket 10, and the requirement of separate securing of the electronic package 20 and the heat sink 30 relative to the ZIF socket 10.

Turning now to FIGS. 6–10, example advanced ZIF sockets having heat sink alignment and retention according to various embodiments of the present invention are illustrated. These particular advanced ZIF sockets may be constructed with one or more of the following primary advantages: first, to prevent the heat sink from damaging an electronic package such as an open die microprocessor chip upon impact due to uneven loading often with excessive forces and/or loading at an angle during assembly. Second, to eliminate an extra step needed to secure a heat sink at a different time from an electronic package on a ZIF socket. Third, to eliminate the requirement of a separate retainer clip used to hold the heat sink in place relative to the ZIF socket. The cam mechanism of the ZIF socket may be arranged to provide not only the securing function, but also predetermined loading (pressure) of the heat sink onto the electronic package Lastly, to maximize the thermal performance of the heat sink by eliminating clearance space for the retainer clip, thereby allowing the cooling fins of the heat sink to distribute across the entire heat sink.

Figure 6:
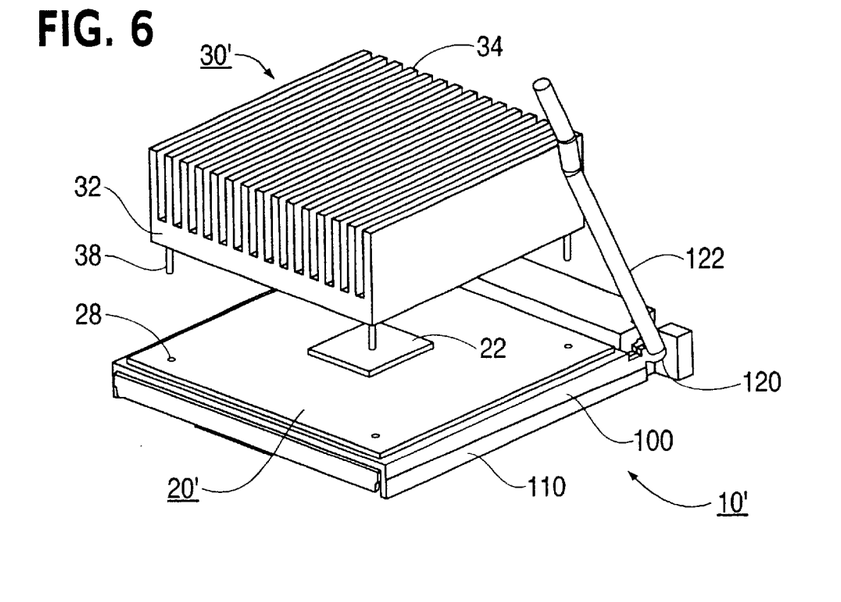
FIG. 6 is a partially exploded perspective view of an example advanced zero-insertion force (ZIF) socket with a lever in an open position for allowing insertion of an electronic package and a heat sink according to a first example embodiment of the present invention.

FIG. 6 is a perspective view of an example advanced zero-insertion force (ZIF) socket 10' with a lever 122 rotated to an open position for securing an electronic package 20' and a heat sink 30' onto a system board of a computer system according to a first example embodiment of the present invention. As shown in FIG. 6, the heat sink 30' may contain a metallic plate 32 with a flat bottom surface, and a large number of cooling (radiation) fins 34 extending or projecting upwardly from a top surface of the flat plate 32 defining a series of channels for dissipating heat generated from the electronic package 20'. The heat sink 30' may also contain a plurality of alignment and retention pins 38 extending or projecting downwardly from a bottom surface of the flat plate 32, for example, at respective corners. For example, at least four or more alignment and retention pins 38 may be respectively inserted into selected clearance openings 28 of the electronic package 20' and corresponding retention grooves (not shown) of the ZIF socket 10' during assembly. However, the number of alignment and retention pins 38 of the heat sink 30' may be flexible so long as the heat sink 30' may be aligned and secured on the electronic package 20' relative to the ZIF socket 10'. The alignment and retention pins 38 of the heat sink 30' may contain a projecting helical rib (screw thread) at each distal end which may be readily snapped into the corresponding retention grooves (not shown) of the ZIF socket 10', via the selected clearance openings 28 of the electronic package 20'. Optionally, other equivalent structures such as retention tongues may be used instead of the alignment and retention pins 38 for insertion into selected clearance openings 28 of the electronic package 20'.

The alignment and retention pins 38 of the heat sink 30 help to insure that the heat sink 30 approaches an open die microprocessor chip 22 of the electronic package 20' in an even parallel and slow fashion during assembly. More particularly, these alignment and retention pins 38 cause assembly people to slow down and carefully align the heat sink 30' relative to the ZIF socket 10' and the electronic package 20' during the loading of the heat sink 30' relative to the ZIF socket 10' so as to prevent physical damage to an open die. The retention pins 38 may be mounted onto the bottom surface of the heat sink 30', or may be machined from the heat sink 30'. In addition to invoking slow parallel alignment and loading, use of retention pins 38 may further be provided in a predetermined configuration or pattern, such that the heat sink can only be installed in a single predetermined installation position. Such may be important in situations where, for example, the heat sink cooling fins must be at a predetermined angle in order to make most efficient use of a cooling air flow through a chassis.

The advanced ZIF socket 10' may include retention grooves (not shown) in addition to an array of pin insertion apertures 112 at the base. The retention grooves may be especially designed as openings (receptacles) of the base 110 and the corresponding apertures of the top plate 100 so as to accommodate the alignment and retention pins 38 of the heat sink 30'. Each retention groove may contain a spring mechanism (not shown) for securing a corresponding one of the alignment and retention pins 38 of the heat sink 30' in place after the alignment and retention pins 38 of the heat sink 30' are inserted thereto and the lever 122 activated. When the lever 122 of the cam mechanism 120 is in an open position, the alignment and retention pins 38 of the heat sink 30' may be easily inserted into the corresponding retention grooves of the ZIF socket 10', via the selected clearance openings 28 of the electronic package 20'.

Figure 7:
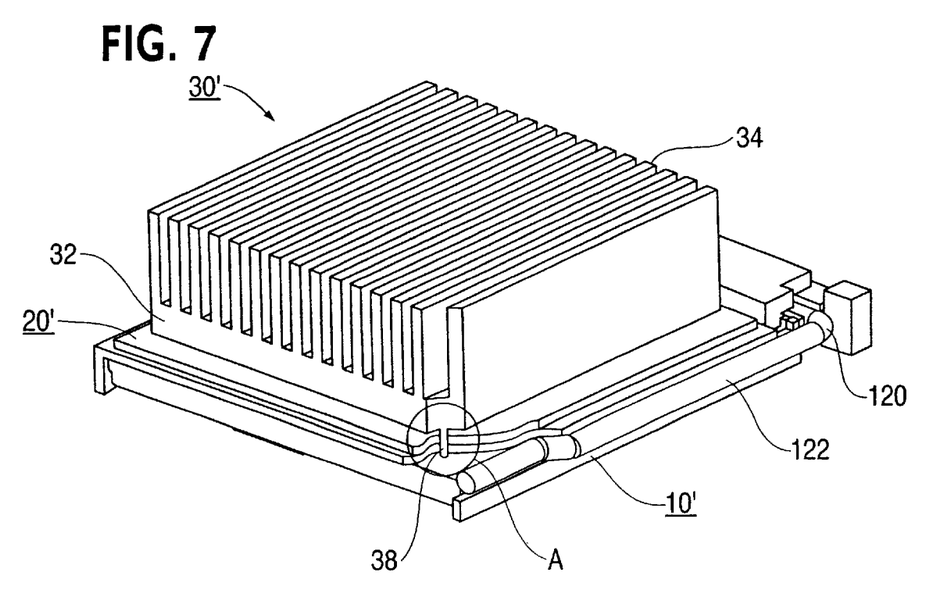
FIG. 7 is a perspective view of an example advanced zero-insertion force (ZIF) socket shown in FIG. 6, when a lever is rotated to a closed position to secure an electronic package and a heat sink in place according to the principles of the present invention.

FIG. 7 is a perspective view of an advanced ZIF socket 10' shown in FIG. 6, when a lever 122 is rotated to a closed position to secure an electronic package 20' and a heat sink 30' in place. After the alignment and retention pins 38 of the heat sink 30' are inserted into the corresponding retention grooves of the ZIF socket 10', the lever 122 of the cam mechanism 120 may be rotated (pivoted) from an open position to a closed position, thereby forcing the spring mechanism (not shown) of the base 110 of the ZIF socket 10' to clamp on the alignment and retention pins 38 of the heat sink 30' in place relative to the ZIF socket 10 in a similar fashion as the pins of an electronic package 20' as described with reference to FIGS. 1–5.

Figure 8:
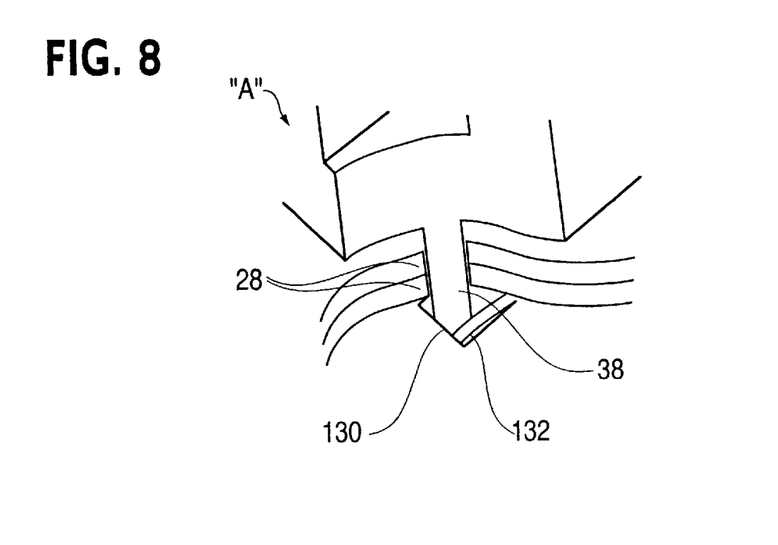
FIG. 8 is a partial cut-way view of example alignment and retention pin/clearance holes and corresponding example retention grooves of the example advanced zero-insertion force (ZIF) socket, the electronic package and the heat sink according to the principles of the present invention.

FIG. 8 is a magnified cut-away view of the FIG. 7 region "A" and illustrates alignment and retention pin/clearance holes and a corresponding retention groove 130 of the ZIF socket 10', the electronic package 20' and the heat sink 30' clamped in place. Each retention groove 130 may be formed at the base 110 of the ZIF socket 10' at each corner, and is shown to accommodate insertion of a corresponding alignment and retention pin 38 of the heat sink 30', via clearance holes 28 of the electronic package 20' and the top plate 100 of the ZIF socket 10'. A spring mechanism 132 included in each retention groove 130 of the base 110 of the ZIF socket 10' creates a clamp force on the alignment and retention pins 38 of the heat sink to clamp or fixedly retain the heat sink 30' in place relative to the ZIF socket 10', when the lever 122 rotates from an open position to a closed position.

As shown in FIGS. 6–8, the lengths of the alignment and retention pins 38 of the heat sink 30' and the depths of the corresponding retention groove 130 may be proportional so as to serve as an effective stop for the heat sink 30'. This may be necessary to ensure that the open die microprocessor chip 22 will not experience excessive forces during assembly. For example, if the alignment and retention pins 38 of the heat sink 30' are set for ½ to 1 mm, the retention groove 130 of the ZIF socket 10' may be cut with a corresponding depth of approximately ½ to 1 mm. Since parallel loading is used with the alignment and retention features of the advanced ZIF socket 10', the open die microprocessor chip 22, and the heat sink 30', the loading force of the heat sink 30' may be distributed evenly across the entire area of the electronic package 20'. As a result, any damage to an open die microprocessor chip 22 of an electronic package 20' due to an uneven loading and/or excessive loading at an angle during assembly can be advantageously and substantially reduced or avoided. In addition, any scratch and/or damage to a thermal interface material disposed on the electronic package 20' can be reduced. Moreover, since the alignment and retention pins 38 of the heat sink 30' may be secured by the retention groove 130 of the ZIF socket 10' via the spring mechanism 132, there may be no need to use a separate retainer clip for holding the heat sink 30' in place relative to the ZIF socket 10'. Without the need for a groove to accommodate such retaining clip, the cooling fins 34 of the heat sink 30' may be distributed evenly across the entire flat plate 32 for increased thermal performance of the heat sink 30'.

Figure 9:
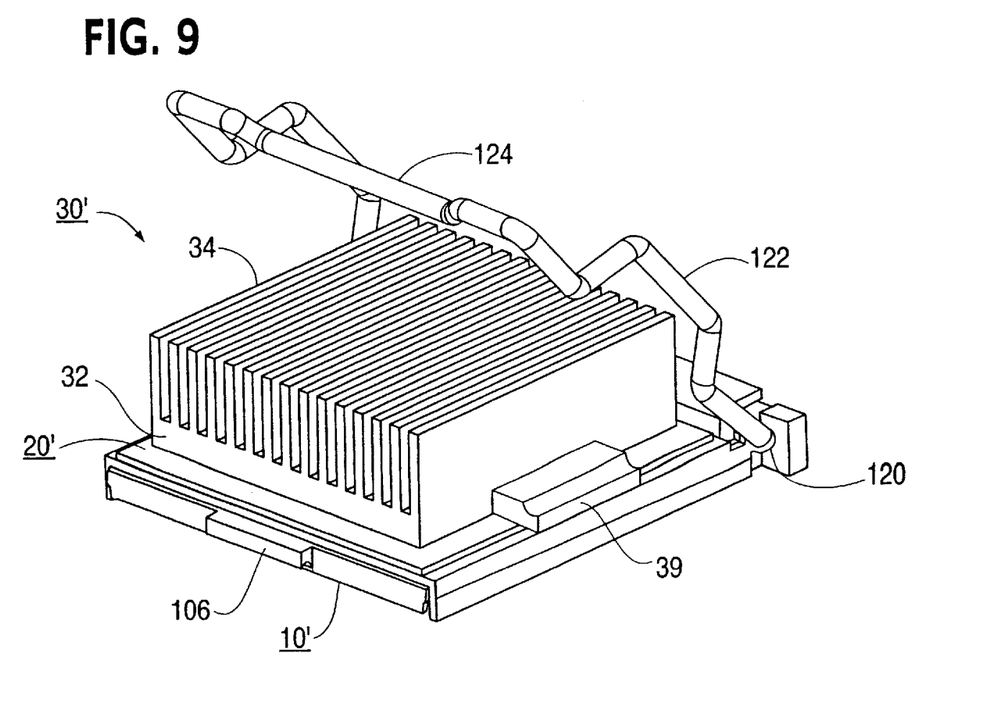
FIG. 9 is a perspective view of another example advanced zero-insertion force (ZIF) socket with a lever in an open position for securing an electronic package and a heat sink according to a second example embodiment of the present invention.

FIG. 9 is a perspective view of an advanced ZIF socket 10' with a lever 122 rotated to an open position for securing an electronic package 20' and a heat sink 30' onto a system board of a computer system according to a second example embodiment of the present invention. As shown in FIG. 8, the heat sink 30' may contain the same metallic plate 32 with a plurality of cooling fins 34 extending or projecting upwardly from the top surface of the flat plate 32 defining a series of channels. In addition, the heat sink 30' may include heat sink retention protrusions 39 extending or projecting laterally from one or more predetermined (e.g., opposite) sidewalls. These retention protrusions 39 may be bolted on the heat sink 30', or may be machined as part of the heat sink 30'.

The ZIF socket 10' may also contain a lever retention protrusion 106 extending laterally from a sidewall opposite to the cam mechanism 120. The cam mechanism 120 may be the same mechanism as that described with reference to FIGS. 1–4. However, the lever 122 may be constructed as a rectangular bail with a cross bar 124 joining parallel sides of the cam mechanism 120. The lever 122 may contain an arch shaped retention journal at parallel sides of the cam mechanism 120 for clamping the heat sink 30' in place, via resting on and/or engaging heat sink retention protrusions 39. The cross bar 124 may also contain an arch shaped retention journal for clamping the heat sink 30' in place, via the lever retention protrusion 106 of the ZIF socket 10'.

The lever 122 constructed as a rectangular bail with a cross bar 124 joining parallel sides of the cam mechanism 120 may serve to actuate the top plate 100 of the ZIF socket 10' to lock the pins (electrical contacts) of an electronic package 20' in an electrical engagement with the respective spring elements 114 of the base 110, while simultaneously securing the heat sink in place relative to the ZIF socket 10'. The lever 122 may be constructed for compactness. The arch shaped retention journals at parallel sides of the cam mechanism 120 may be cylindrical or relatively thin and lie alongside the heat sink retention protrusions 39 of the heat sink 30' respectively. The cross bar 124 may be cylindrical or may contain a widened surface serving as a handle for closing and opening a ZIF socket 10'.

The bail may span the top plate 100 of the ZIF socket 10' and define a clearance between the bail and the top plate 100 for an electronic package 20' and a heat sink 30' on the top plate 100. The elevated construction of the bail may be adapted to pass over the heat sink 30' upon pivoting the lever 122 of the cam mechanism 120 for easy installation and removal of the electronic package 20' and the heat sink 30'. No force may be necessary to lock the electronic package 20' and the heat sink 30' in place relative to the ZIF socket 10'.

Figure 10:
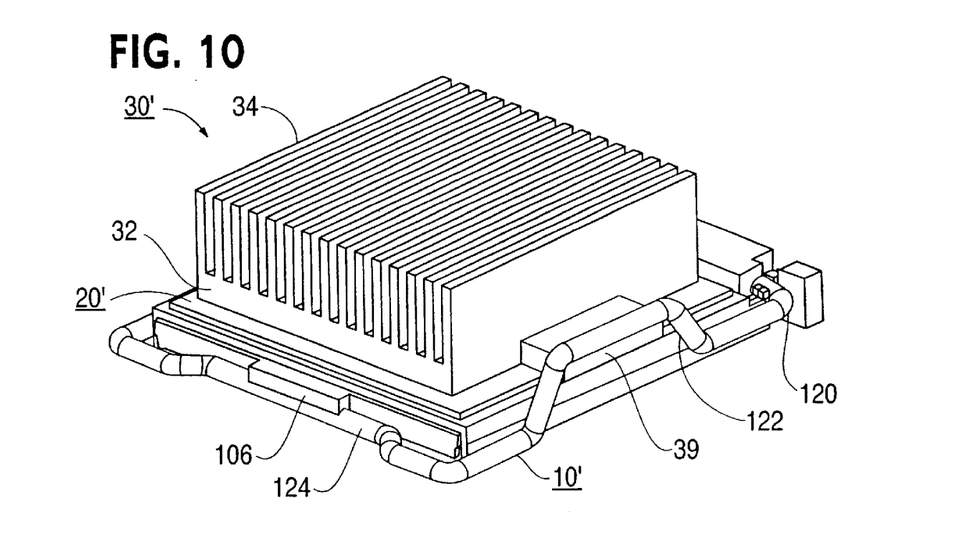
FIG. 10 is a perspective view of an example advanced zero-insertion force (ZIF) socket shown in FIG. 9, when a lever is rotated to a closed position to secure an electronic package and a heat sink in place according to the principles of the present invention.

FIG. 10 is a perspective view of the FIG. 9 advanced ZIF socket 10', electronic package 20', and heat sink 30' clamped in place by way of the lever 122 of the cam mechanism 120, the heat sink protrusions 39 of the heat sink 30', and the lever retention protrusion 106 of the ZIF socket 10'. The cam mechanism 120 is rotated by pivoting the lever 122 from an open position to a closed position. When the lever 122 is pivoted toward a closed position as shown in FIG. 9, the lever 122 is coupled with the heat sink with the lever retention protrusion 106 of the ZIF socket 10' and clamped down the heat sink 30' by way of the heat sink retention protrusion 39. These retention features of the ZIF socket 10' as shown in FIGS. 9 and 10 allow the heat sink 30' to be clamped to the electronic package 20' at the same time, i.e., with the same motion, as the electronic package 20' is clamped to the ZIF socket 10' while concomitantly locking the pins of the electronic package 20' in an electrical engagement with the respective spring elements 114 of the base 110 of the ZIF socket 10'. As a result, the extra step needed to secure a heat sink 30' at a different time from an electronic package 20' on a ZIF socket 10' can be eliminated entirely. An extra component such as a separate clip used to secure the heat sink 30' in place relative to the ZIF socket 10' can also be eliminated entirely, since the ZIF socket 10' now retains the heat sink 30'. In addition, the thermal performance of the heat sink 30' can be effectively maximized by eliminating clearance space of the heat sink 30' for the retainer clip so as to allow the cooling fins of the heat sink to distribute across the entire heat sink 30'. In extreme environments, (e.g., vibrating automotive engine compartments) where additional securing/retention is needed, the retaining clip can be used in addition to the present invention.

Figure 11:
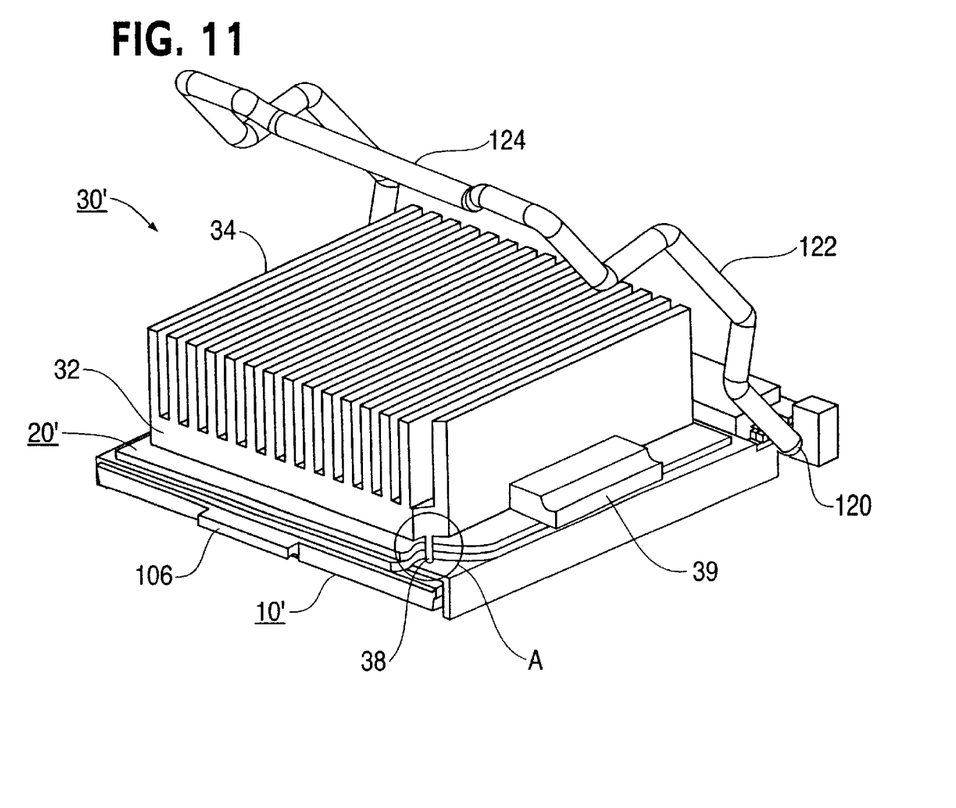
FIG. 11 is a perspective view of yet another example advanced zero-insertion force (ZIF) socket for securing an electronic package and a heat sink onto a system board of a computer system according to a third example embodiment of the present invention.

FIG. 11 is a perspective view of an advanced ZIF socket 10' with a lever 122 rotated to an open position for securing an electronic package 20' and a heat sink 30' onto a printed circuit board (PCB) of a computer system according to a third example embodiment of the present invention. As shown in FIG. 11, the alignment and retention pins 38 may be installed to require slow parallel alignment and loading of a heat sink 30' onto an electronic package 20' to prevent damage due to an uneven and/or angular loading with excessive forces during assembly. These alignment and retention pins 38 may be used in conjunction with the lever 122 constructed as a rectangular bail with a cross bar 124 joining parallel sides of the cam mechanism 120 as described with reference to FIGS. 9–10.

As yet another example embodiment, while the FIGS. 9–11 embodiments have been described where the heat sink includes especially provided protrusions 39 which are clamped by the lever 122, the lever 122 may instead be designed to slice between preexisting cooling fin grooves and clamp down the heat sink 30' using the same. Such example embodiment is advantageous in eliminating the need and cost of special protrusions.

Similarly, while the retention pins 38 have been described as part of the heat sink 30', any or all of the retention pins can just as easily be provided as part of the ZIF socket 10'. Likewise, while the retention pin clearance openings 28 have been described as part of the electronic package 20' and the ZIF socket 10', any or part of the retention pin clearance opening 28 can just as easily be provided as a part of the heat sink 30'. Retention pins provided as part of the ZIF socket 10' may be advantageous in that they avoid a situation where a heat sink retention pin can directly impact and severely damage the open die microprocessor 22 as the heat sink 30' is misaligned and loaded with force onto the electronic package 20'.

In addition, while in the above example embodiments, the ZIF socket 10' is described as engaging and securing pins of the electronic package 20', such engaging/securing of the electronic package 20' may be unnecessary in another example embodiment. For example, if a ball grid array (BGA) type of electronic package/interconnect is used to accommodate electrical connection between the ZIF socket 10' and the electronic package 20', the securing/clamping of an overlying heat sink 30' can be used to sandwich and clamp the electronic package 20'.

As described from the foregoing, the advanced zero-insertion force (ZIF) sockets according to the present invention have different heat sink alignment and retention features that can prevent the heat sink from damaging an electronic package such as an open die microprocessor chip due to uneven loading and/or excessive forces during assembly, and can eliminate the separate assembly of the open die microprocessor chip, the heat sink and the additional clips used to secure the heat sink in place while concomitantly maximizing the thermal performance of the heat sink.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, the electrical contacts of the pin insertion apertures may be available in a variety of size and shapes with different projections. The cam mechanism may include different driving elements such as worm gears, wedges, ratchets, etc. Moreover, the camshaft of the cam mechanism may be positioned at various angles and may work with different sized and/or shaped lever. The overall dimensions of the ZIF socket may be altered depending upon the electrical elements used, the desired strength, the structural rigidity, and the thermal stability. More importantly, different alignment mechanisms may be used in lieu of the alignment and retention pins of the heat sink as shown in FIGS. 6–8 as long as the heat sink may be aligned for loading on a ZIF socket. In addition, different sizes and shapes of the lever may be alternatively used in lieu of the bail lever shown in FIGS. 9–11 as long as the lever may serve to actuate the top plate of the ZIF socket to lock the pins (electrical contacts) of an electronic package in an electrical engagement with the respective spring elements of the base of the ZIF socket while concomitantly securing the heat sink in place relative to the ZIF socket. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A socket system, comprising:
    an electronic package;
    a heat sink having heat sink alignment and retention protrusions;
    a socket for coupling said electronic package and said heat sink, said socket comprising:
        a base having a plurality of receptacles adapted to receive electrical connections of said electronic package, and a lever retention protrusion extending laterally from a sidewall;
        a top plate slidably mounted on the base, having a plurality of pin insertion apertures adapted to permit insertion of the electrical connections of said electronic package; and a cam mechanism which is operable for sliding the top plate over the base between an open position and a closed position, to permit insertion of the electrical connections of said electronic package into respective insertion apertures of the base and to secure the electrical connections of said electronic package with respective receptacles of the base, while simultaneously securing said heat sink on top of said electronic package, via said lever retention protrusion extending laterally from the sidewall of the base.

2. The socket system as claimed in claim 1, wherein said cam mechanism comprises:

a camshaft; and a lever constructed as a rectangular bail with a cross bar joining parallel sides of the camshaft, and having an arch shaped retention journal at parallel sides of the camshaft for clamping said heat sink on top of said electronic package, via said heat sink alignment and retention protrusions of said heat sink.

3. The socket system as claimed in claim 2, wherein said cross bar of said cam mechanism also has an arch shaped retention journal for clamping said heat sink on top of said electronic package, via the lever retention protrusion of the base.

4. The socket system as claimed in claim 3, wherein said cam mechanism operates to slide the top plate over the base in a first direction to permit insertion of the electrical connections of said electronic package into respective apertures of the base, and for sliding the top plate over the base in a second direction opposite to said first direction to secure an electrical coupling of the electrical connections of said electronic package with the receptacles of the base, while simultaneously securing said heat sink in alignment on top of said electronic package and the base, via said heat sink alignment and retention protrusions of said heat sink.

5. The socket system as claimed in claim 4, wherein said lever constructed as a rectangular bail with said cross bar serves to actuate the top plate to lock the electrical connections of said electronic package in electrical engagement with the respective spring elements of the base while simultaneously securing the heat sink in place relative to said socket.

6. The socket system as claimed in claim 4, wherein said lever constructed as a rectangular bail spans the top plate and defines a clearance for said electronic package and said heat sink on the top plate for easy installation and removal of said electronic package and said heat sink.

7. The socket as claimed in claim 4, wherein said heat sink further comprises a plurality of alignment and retention pins projecting downwardly from a bottom surface of the flat plate for loading alignment into respective apertures of the base, via said electronic package.

8. A socket for coupling an electronic package and a heat sink having a heat sink alignment and retention means, comprising:

a base having a plurality of receptacles adapted to receive electrical connections of an electronic package;

a top plate mounted on the base, having a plurality of pin insertion apertures adapted to permit insertion of the electrical connections of said electronic package; and a secure mechanism which is operable to permit insertion of the electrical connections of said electronic package into respective apertures of the base, and to secure an electrical coupling of the electrical connections of said electronic package with the receptacles of the base while simultaneously securing said heat sink in alignment on top of said electronic package and the base, via said heat sink alignment and retention means, said secure mechanism sliding the top plate over the base in a first direction to permit insertion of the electrical connections of said electronic package into respective apertures of the base, and alternatively sliding the top plate over the base in a second, opposite direction to secure said electrical coupling of the electrical connections of said electronic package with the receptacles of the base.

9. The socket as claimed in claim 8, wherein said heat sink comprises:

a plate with a flat bottom surface;

a plurality of radiation fins projecting upwardly from a top surface of the flat plate and defining a series of channels, for dissipating heat generated from said electronic package; and said heat sink alignment and retention means corresponding to a plurality of alignment and retention pins projecting downwardly from a bottom surface of the flat plate for insertion into respective apertures of the base, via said electronic package.

10. The socket as claimed in claim 9, wherein said electronic package includes selected clearance openings for accommodating the alignment and retention pins of said heat sink, and each of the alignment and retention pins of said heat sink contains a projecting helical rib at each distal end insertable into corresponding retention grooves of the base, via said selected clearance openings.

11. The socket as claimed in claim 10, wherein said retention grooves of the base each contains a spring mechanism to secure a corresponding one of the alignment and retention pins of said heat sink in place relative to said socket.

12. The socket as claimed in claim 8, wherein said secure mechanism is a cam mechanism.

13. The socket as claimed in claim 12, wherein said cam mechanism is mounted in a tunnel between the top plate and the base, and includes a camshaft, a lever which is transversely connected for rotating the camshaft in first and second directions, causing the top plate to slide over the base between an open position and a closed position, said lever having an end portion s which is bent at an angle from a main axis for allowing the lever to be easily grasped for rotation in the first and second directions.

14. The socket as claimed in claim 8, wherein said electronic package corresponds to a substrate supporting an open die microprocessor chip.

15. The socket as claimed in claim 8, wherein said heat sink comprises:

a plate;

a plurality of radiation fins projecting upwardly from a top surface of the plate and defining a series of channels, for dissipating heat generated from the electronic package; and said heat sink alignment and retention means corresponding to heat sink retention protrusions projecting laterally from opposite sides of the plate for enabling said heat sink secured in place on top of said electronic package and the base.

16. The socket as claimed in claim 15, wherein said base further contains a lever retention protrusion extending laterally from a sidewall opposite to said secure mechanism for enabling said heat sink secured in place on top of said electronic package.

17. The socket as claimed in claim 16, wherein said secure mechanism is a cam mechanism operable for sliding the top plate over the base in a first direction to permit insertion of the electrical connections of said electronic package into respective apertures of the base, and for sliding the top plate over the base in a second, opposite direction to secure said electrical coupling of the electrical connections of said electronic package with the receptacles of the base.

18. The socket as claimed in claim 17, wherein said cam mechanism comprises:
   a camshaft;
   a lever constructed as a rectangular bail with a cross bar joining parallel sides of the camshaft, and having an arch shaped retention journal at parallel sides of the camshaft for clamping said heat sink on top of said electronic package, via the heat sink retention protrusions of said heat sink, and
   said cross bar further having an arch shaped retention journal for clamping said heat sink on top of said electronic package, via the lever retention protrusion of the base.

19. The socket as claimed in claim 18, wherein said lever constructed as a rectangular bail with said cross bar serves to actuate the top plate to lock the pins of said electronic package in electrical engagement with the respective spring elements of the base while simultaneously securing said heat sink in place relative to said socket.

20. The socket as claimed in claim 19, wherein said lever constructed as a rectangular bail spans the top plate and defines a clearance for said electronic package and said heat sink on the top plate for easy installation and removal of said electronic package and said heat sink.

21. The socket as claimed in claim 20, wherein said heat sink further comprises a plurality of alignment and retention pins projecting downwardly from a bottom surface of the flat plate for loading alignment into respective apertures of the base, via said electronic package.

22. A socket for coupling an electronic package having selected openings and a plurality of electrical connections and a heat sink having a plurality of alignment and retention pins, comprising:
   a base having a plurality of receptacles adapted to receive electrical connections of an electronic package with selected receptacles adapted to receive alignment and retention pins of a heat sink, via said selected openings of said electronic package;
   a top plate slidably mounted on the base, having a plurality of pin insertion apertures adapted to permit insertion of the electrical connections of said electronic package with selected apertures adapted to permit insertion of the alignment and retention pins of said heat sink, via said selected openings of said electronic package; and
   a cam mechanism which is operable for sliding the top plate over the base between an open position and a closed position to permit insertion of the electrical connections of said electronic package and the alignment and retention pins of said heat sink into respective apertures of the base, and to secure an electrical coupling of the electrical connections of said electronic package with the receptacles of the base while simultaneously securing the alignment and retention pins of said heat sink in place, via said selected openings of said electronic package.

23. The socket as claimed in claim 22, wherein said heat sink comprises:
   a plate with a flat bottom surface;
   a plurality of radiation fins projecting upwardly from a top surface of the flat plate and defining a series of channels, for dissipating heat generated from the electronic package; and
   a plurality of alignment and retention pins projecting downwardly from a bottom surface of the flat plate for insertion into respective apertures of the base, via said electronic package.

24. The socket as claimed in claim 23 wherein each of the alignment and retention pins of said heat sink contains a projecting helical rib at each distal end for insertion into corresponding retention grooves of the base, via said selected clearance openings.

25. The socket as claimed in claim 24, wherein said retention grooves of the base each contains a spring mechanism to secure a corresponding one of the alignment and retention pins of said heat sink in place relative to said socket.

26. The socket as claimed in claim 25, wherein said cam mechanism is mounted in a tunnel between the top plate and the base, and includes a camshaft, a lever which is transversely connected for rotating the camshaft in first and second directions, causing the top plate to slide over the base between an open position and a closed position, said lever having an end portion which is bent at an angle from a main axis for allowing the lever to be easily grasped for rotation in the first and second directions.

27. A socket for coupling an electronic package and a heat sink having a plate, a plurality of radiation fins projecting upwardly from the plate, and heat sink alignment and retention protrusions projecting laterally from opposite sides of the plate, said socket comprising:
   a base having a plurality of receptacles adapted to receive electrical connections of an electronic package, and a lever retention protrusion extending laterally from a sidewall;
   a top plate slidably mounted on the base, having a plurality of pin insertion apertures adapted to permit insertion of the electrical connections of said electronic package; and
   a cam mechanism which is operable for sliding the top plate over the base between an open position and a closed position, said cam mechanism comprising:
   a camshaft;
   a lever constructed as a rectangular bail with a cross bar joining parallel sides of the camshaft, and having an arch shaped retention journal at parallel sides of the camshaft for clamping a heat sink on top of said electronic package, via heat sink alignment and retention protrusions of said heat sink, and
   said cross bar further having an arch shaped retention journal for clamping said heat sink on top of said electronic package, via the lever retention protrusion of the base.

28. The socket as claimed in claim 27, wherein said cam mechanism operates to slide the top plate over the base in a first direction to permit insertion of the electrical connections of said electronic package into respective apertures of the base, and for sliding the top plate over the base in a second direction opposite to said first direction to secure an electrical coupling of the electrical connections of said electronic package with the receptacles of the base while simultaneously securing said heat sink in alignment on top of said electronic package and the base, via said heat sink alignment and retention protrusions of said heat sink.

29. The socket as claimed in claim 28, wherein said lever constructed as a rectangular bail with said cross bar serves to actuate the top plate to lock the electrical connections of said electronic package in electrical engagement with the respective spring elements of the base while simultaneously securing said heat sink in place relative to said socket.

30. The socket as claimed in claim 29, wherein said lever constructed as a rectangular bail spans the top plate and defines a clearance for said electronic package and said heat sink on the top plate for easy installation and removal of said electronic package and said heat sinks.

31. The socket as claimed in claim 30, wherein said heat sink further comprises a plurality of alignment and retention pins projecting downwardly from a bottom surface of the flat plate for loading alignment into respective apertures of the base, via said electronic package.

* * * * *